United States Patent [19]
Li et al.

[11] Patent Number: 6,140,206
[45] Date of Patent: Oct. 31, 2000

[54] METHOD TO FORM SHALLOW TRENCH ISOLATION STRUCTURES

[75] Inventors: Jian Xun Li; Qing Hua Zhong; Mei Sheng Zhou, all of Singapore, Singapore

[73] Assignee: Chartered Semiconductor Manufacturing Ltd., Singapore, Singapore

[21] Appl. No.: 09/332,425

[22] Filed: Jun. 14, 1999

[51] Int. Cl.[7] .................................................. H01L 21/76
[52] U.S. Cl. .......................... 438/424; 438/221; 438/296; 438/359
[58] Field of Search ................... 438/221, 296, 438/424, 359

[56] References Cited

U.S. PATENT DOCUMENTS

| | | | |
|---|---|---|---|
| 5,130,268 | 7/1992 | Liou et al. | 438/425 |
| 5,677,229 | 10/1997 | Morita et al. | 438/424 |
| 5,696,021 | 12/1997 | Chan et al. | 437/72 |
| 5,776,808 | 7/1998 | Muller et al. | 438/243 |
| 5,786,263 | 7/1998 | Perera | 438/431 |
| 5,801,083 | 9/1998 | Yu et al. | 438/424 |
| 5,814,547 | 9/1998 | Chang | 438/329 |
| 5,817,568 | 10/1998 | Chao | 438/427 |
| 5,943,590 | 8/1999 | Wang et al. | 438/427 |
| 5,994,201 | 11/1999 | Lee | 438/424 |
| 5,998,278 | 12/1999 | Yu | 438/424 |

*Primary Examiner*—Charles Bowers
*Assistant Examiner*—David S Blum
*Attorney, Agent, or Firm*—George O. Saile; Rosemary L. S. Pike

[57] ABSTRACT

A method of forming a shallow trench isolation trenches in a silicon substrate of an integrated circuit device is achieved. A silicon substrate is provided. A buffer layer is deposited overlying the silicon substrate. An etching endpoint layer is deposited overlying the buffer layer. A silicon layer is deposited layer overlying the etching endpoint layer. A photoresist layer is coated overlying the silicon layer. The photoresist layer is developed wherein the photoresist layer is removed where the trenches are planned. The silicon layer, the etching endpoint layer, and the buffer layer are etched through to expose the top surface of the silicon substrate. The silicon layer and the silicon substrate layer are etched until the top surface of the etching endpoint layer is exposed, and the trenches are thereby formed. The integrated circuit device is completed.

20 Claims, 3 Drawing Sheets

METHOD TO FORM SHALLOW TRENCH ISOLATION STRUCTURES

BACKGROUND OF THE INVENTION (1) Field of the Invention

The invention relates to a method of fabricating semiconductor structures, and more particularly, to the formation of shallow trench isolation structures in integrated circuit devices.

(2) Description of the Prior Art

Shallow trench isolation (STI) is a commonly used technique for forming electrical isolation structures in integrated circuit manufacture. STI structures are smaller than the traditional local oxidation of silicon (LOCOS) and are therefore better suited for modern ULSI circuits.

The formation of the shallow trench is the most important part of the STI process. Specifically, it is important that the STI trenches be formed at a consistent depth across the integrated circuit wafer and from device to device.

Achieving uniform process capability for the STI structures is especially difficult at CMOS process technologies of less than 0.25 microns. This is because different devices may exhibit very different densities of STI structures. This effect is called reticle transmission (RT). Reticle transmission is simply the open area in the reticle divided by the closed area expressed in percentage. RT describes the percentage of light that will be transmitted through the reticle.

If the RT percentage is very different between two devices, the silicon etching rate of the reactive ion etching (RIE) process will also be different for these devices. In such circumstances, either the trench etch process must be specifically tuned for each device or the process specifications must be unduly large.

Referring to FIG. 1, a cross-section of a partially completed prior art STI structure is shown. A trench has been etched in a silicon substrate 10. Overlying the substrate 10 are a pad oxide layer 14 and a silicon nitride hard mask layer 18. A RIE etch has been performed to create the trench using the hard mask layer 18 as a mask. Note that the aspect ratio of the overall trench is defined by the depth L3 divided by the width L2. Note additionally that the depth of the trench etched into the silicon substrate 10 is L1.

It should be clear that, as the trench is etched into the substrate 10, the aspect ratio is increasing. In RIE etching, as the aspect ratio increases, the etch rate will be changed due to microloading effects. This makes controlling the final trench depth L1 more difficult, especially since there is no etch endpoint detection mechanism. In addition, the etch rate is also affected by factors such as RT and the cleanliness of the etch chamber. Consequently, the final depth L1 for a given STI structure can vary greatly from device to device and from production lot to production lot. Finally, because silicon nitride 18 is used as a hard mask for the etch, some nitrogen is released into the chamber. This nitrogen is deposited in the polymer film that forms on the inside surfaces of the trench during the etch. Removal of the polymer film during the subsequent cleaning operation is made difficult by the presence of this nitrogen inclusion.

Several prior art approaches attempt to improve the manufacturing method for forming trenches in the silicon substrate. U.S. Pat. No. 5,814,547 to Chang teaches a process for dry etching both shallow and deep trenches simultaneously. A hard mask of silicon dioxide over a layer of silicon nitride over a layer of silicon dioxide is used. U.S. Pat. No. 5,776,808 to Muller et al discloses a process to form trenches for capacitors where a TEOS layer is used as the hard mask for the etch. The TEOS is then etched away using an underlying polysilicon layer as an etching stop. U.S. Pat. No. 5,696,021 to Chan et al teaches a process to form isolation structures with side trenches. A layer of $Si_3N_4$ over a polysilicon layer is used as a hard mask for the trench etch.

SUMMARY OF THE INVENTION

A principal object of the present invention is to provide an effective and very manufacturable method of fabricating trenches in the silicon substrate in the manufacture of integrated circuits.

A further object of the present invention is to provide an improved method to fabricate shallow trench isolation structures in an integrated circuit device.

A still further object of the present invention is to provide an improved method to fabricate shallow trench isolation structures in an integrated circuit device that are less sensitive to variation in trench etch rate.

Another still further object of the present invention is to provide an improved method to fabricate shallow trench isolation structures in an integrated circuit device that minimizes reticle transmission dependence.

In accordance with the objects of this invention, a new method of fabricating trenches in the silicon substrate has been achieved. A silicon substrate is provided. A buffer layer is formed overlying the substrate. An etching endpoint layer is deposited overlying the buffer layer. A silicon layer is deposited overlying the etching endpoint layer. A photoresist layer is applied overlying the silicon layer. The photoresist layer is developed and removed in areas where the trenches are planned. The silicon layer, etching endpoint layer, and buffer layer are etched through to expose the top surface of the silicon substrate. The silicon layer and silicon substrate are anisotropically etched, stopping when the top surface of the etching endpoint layer is exposed, and thereby forming the trenches. An isolator layer is deposited overlying the etching endpoint layer and filling the trenches. The isolator layer is polished down to the top surface of the etching endpoint layer. The etching endpoint layer is etched away to complete the shallow trench isolation structures, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
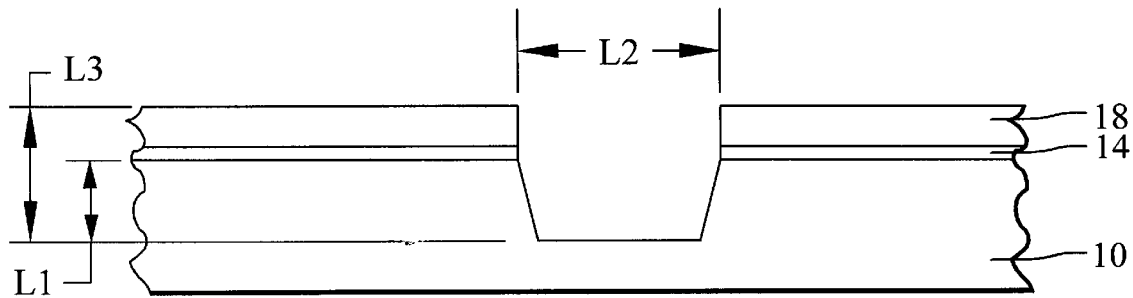
FIG. 1 schematically illustrates in cross-section a partially completed prior art shallow trench isolation in an integrated circuit device.
Figure 2:
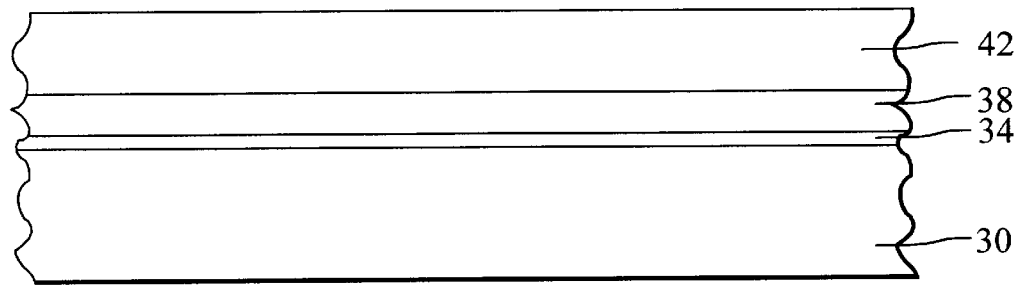
FIGS. 2 through 9 schematically illustrate in cross-sectional representation a preferred embodiment of the present invention.

Referring now more particularly to FIG. 2, there is illustrated a cross section of a partially completed shallow trench isolation in an integrated circuit device. Silicon substrate 30 is preferably composed of monocrystalline silicon. A thin buffer layer 34 is formed overlying the substrate 30. The buffer layer is preferably composed of silicon dioxide that is either deposited or thermally grown. The purpose of the buffer layer 34 is to improve the adhesion of the subsequent layers to the surface of the substrate 30 and to reduce the surface stress. In the preferred embodiment, the silicon dioxide is formed to a thickness of between about 50 Angstroms and 300 Angstroms.

An etching endpoint layer 38 is deposited overlying the buffer layer 34. The etching endpoint layer 38 is preferably composed of silicon nitride deposited by low pressure chemical vapor deposition (LPCVD) to a thickness of between about 500 Angstroms and 3500 Angstroms. The purpose of the endpoint layer 38 is to facilitate the endpoint detection in the subsequent RIE trench etch and to serve as a stop layer for the subsequent chemical mechanical polish process.

A silicon layer 42 is deposited overlying the etching endpoint layer 38. The silicon layer 42 may be composed of either polysilicon or amorphous silicon. The thickness of the silicon layer 42 is an important feature of the present invention. As will be explained below, the silicon thickness directly controls the depth of the substrate trench. The silicon layer 42 may be deposited by either low pressure chemical vapor deposition (LPCVD) or by plasma-enhanced chemical vapor deposition (CVD). In the preferred embodiment, the silicon layer is deposited to a thickness of between about 1000 Angstroms and 7000 Angstroms.

Figure 3:
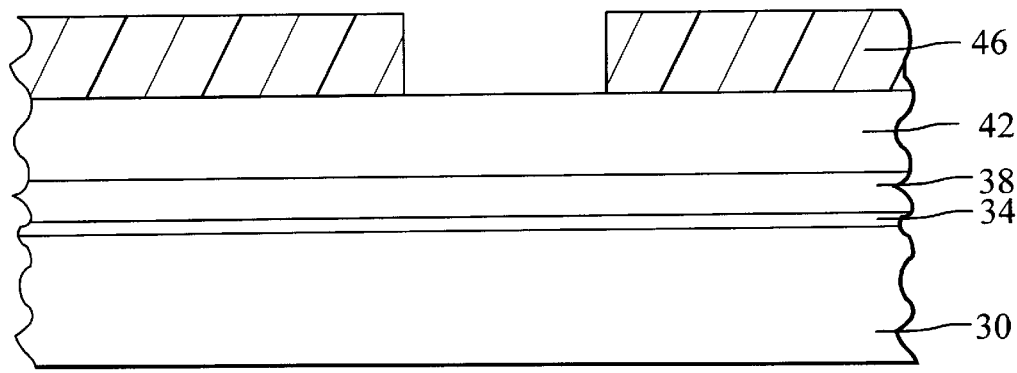

Referring now to FIG. 3, a layer of photoresist 46 is applied overlying the silicon layer 42. The photoresist is conventionally exposed and developed to expose the top surface of the silicon layer 42 in areas where the shallow trench isolations are planned.

Figure 4:
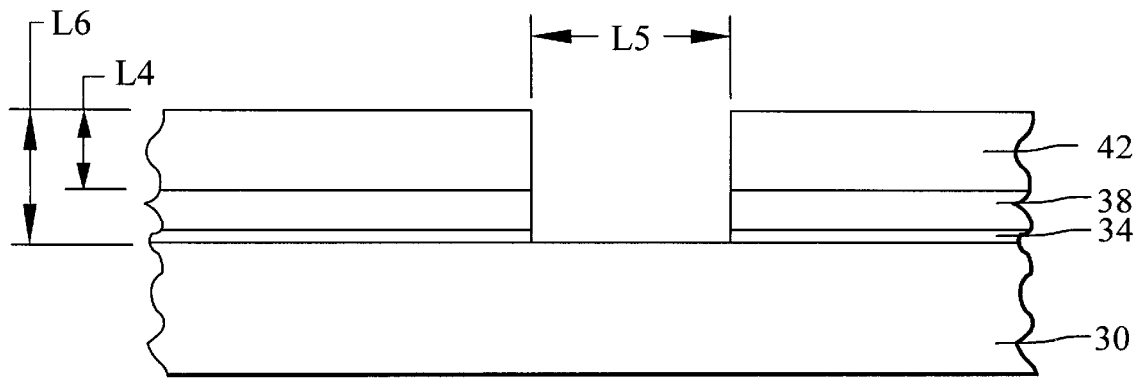

Referring now to FIG. 4, the silicon layer 42, the etching endpoint layer 38, and the buffer layer 34, respectively, are etched through using a dry etching process sequence where they are not covered by the photoresist mask 46.

The photo resist layer 46 is then removed, such as by oxygen ashing. At this point in the process, the silicon layer 42 has a thickness prior to the trench etch of L4. The width of each planned trench is L5. The depth of the hard mask formed by the stack of the silicon layer 42, the etching endpoint layer 38, and the buffer layer 34 is L6. The aspect ratio prior to the trench etch is therefore L6 divided by L5.

Figure 5:
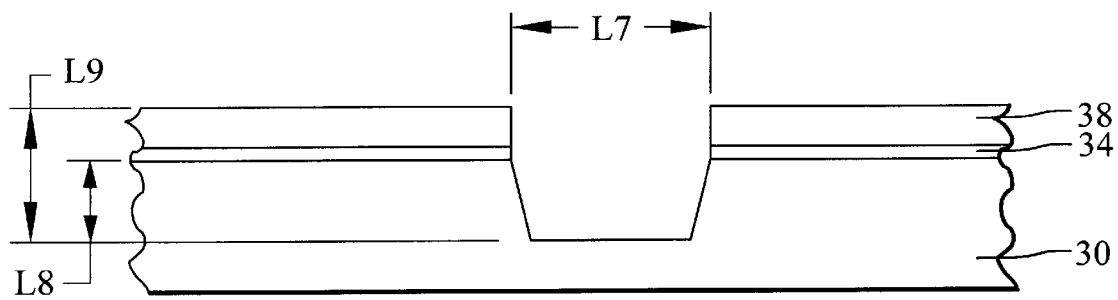

Referring now to FIG. 5, the silicon substrate 30 is now etched using the silicon layer, the etching endpoint layer, and the buffer layer, 42, 38, and 34 respectively, as a hard mask. As an example, in the preferred embodiment, the trenches are etched using a reactive ion etching (RIE) chemistry of HBr, Cl$_2$, and O$_2$ at a pressure of about 20 mTorr.

The trench etch process also etches away the silicon layer 42. When the entire silicon layer 42 is etched away such that the underlying etching endpoint layer 38 is exposed, the reactor then detects endpoint and the etch is stopped.

The special features of the present invention can now be seen. First, the dry etch that etches the substrate 30 trenches also etches the overlying silicon layer 42 in the hard mask. Typically, the etch rate for the silicon 42 and the silicon substrate 30 are very nearly the same. Therefore, when the entire silicon layer 42 is etched away, the depth of the trenches L8 formed in the substrate 30 is very nearly the same as the pre-etch thickness of the silicon layer 42. Since the etch is stopped when the etching endpoint layer 38 is exposed, the depth of the trenches is directly controlled by the thickness of the silicon layer 42. This trench depth control offers an advantage for the present invention when compared to the prior art. Because the depth of the trench depends on the thickness of the silicon layer 42, there is much less variation due to the etch rate. Therefore, factors that influence the silicon etch rate in the trench etch, such as RT and cleanliness of the etch chamber, do not cause large device to device or lot to lot variations in the trench depths as seen in the prior art.

Additionally, note the aspect ratio (L9 divided by L7) of the trench opening. Since the silicon layer 42 is etched down at the same rate that the substrate 30 is etched, the aspect ratio of the etch remains constant during the etch. This causes the etch rate to likewise remain constant in the substrate 30 and reduces etch variation. Finally, because the etch stops when the etching endpoint layer 38 is exposed, much less nitrogen is included in the polymer film that forms inside the trench during the etch. Therefore it is easier to clean the polymer from the trench before proceeding with subsequent processing.

Figure 6:
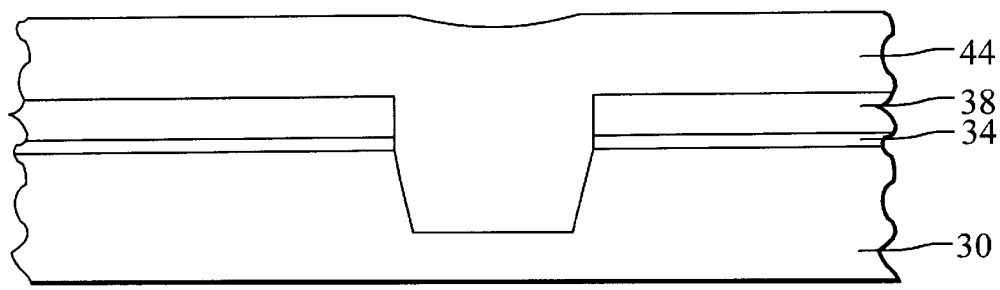

Referring now to FIG. 6, after the post etch clean, an insulator layer 44 is deposited overlying the endpoint layer 38 and filling the shallow trench. The insulator layer 44 is preferably composed of silicon dioxide deposited by chemical vapor deposition (CVD).

Figure 7:
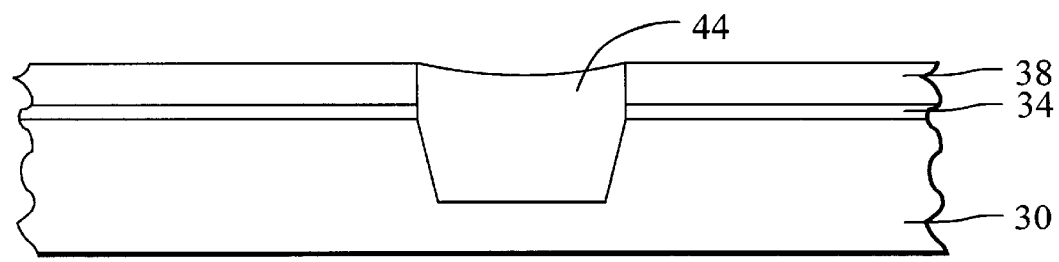

Referring now to FIG. 7, the device is now subjected to a conventional chemical mechanical polish (CMP) to polish down the excess insulator layer 44. The CMP stops at the etching endpoint layer 38.

Figure 8:
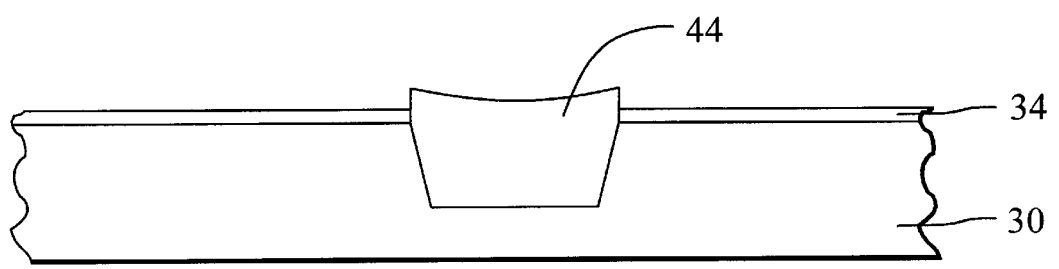

Referring to FIG. 8, after the CMP step, a wet or dry etch that is highly selective to silicon nitride is employed to remove the remaining etching endpoint layer 38. The shallow trench isolation is now complete.

Figure 9:
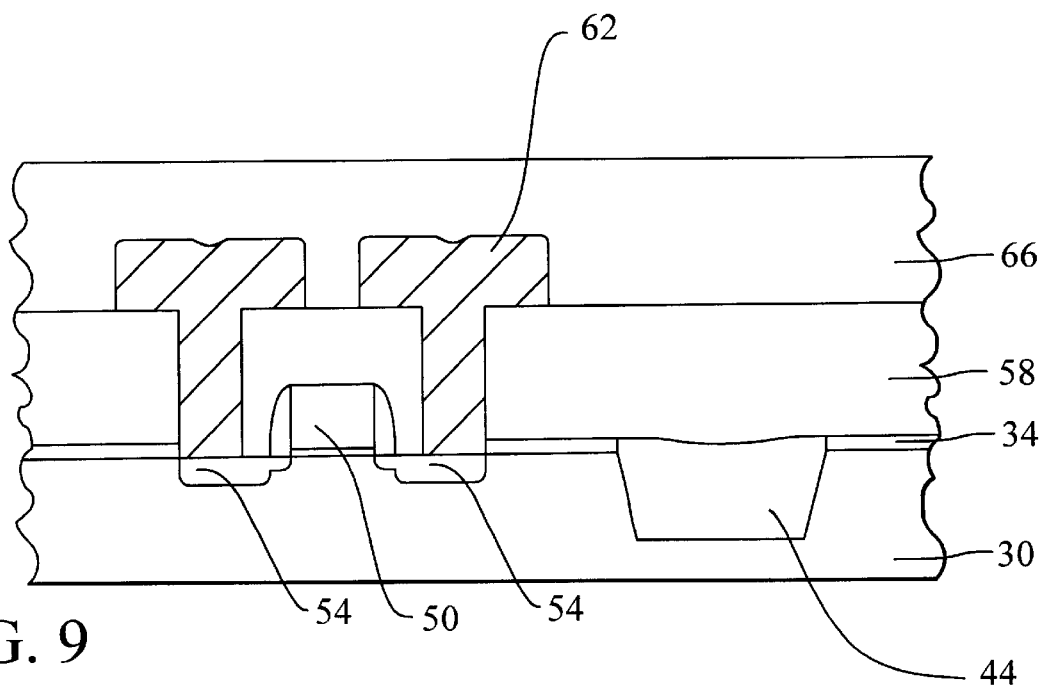

Referring to FIG. 9, processing continues as is conventional in the art to complete the integrated circuit device. For example, active devices such as MOSFETs are formed including transistor gates 50 and drains and sources 54. An interlevel dielectric layer 58 is deposited overlying the active devices. Contact openings are etched. A metal layer 62 is deposited and etched to provide connective traces. A passivation layer 66 of plasma enhanced CVD nitride is deposited overlying the metal layer 62 and the interlevel dielectric layer 58 to complete the integrated circuit device.

As shown in the preferred embodiment, the present invention provides a very manufacturable process for fabricating the shallow trench isolation structures in the manufacture of integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming silicon substrate trenches in an integrated circuit device comprising:

providing a silicon substrate;

forming a buffer layer overlying said silicon substrate;

depositing an etching endpoint layer overlying said buffer layer;

depositing a silicon layer overlying said etching endpoint layer;

coating a photoresist layer overlying said silicon layer;

exposing said photoresist layer to actinic light and developing said photoresist layer wherein said photoresist layer is removed where said trenches are planned;

etching through said silicon layer, said etching endpoint layer, and said buffer layer to expose the top surface of said silicon substrate;

etching said silicon layer and said silicon substrate layer until the top surface of said etching endpoint layer is exposed and thereby forming said trenches; and completing said integrated circuit device.

2. The method according to claim 1 wherein said buffer layer is composed of silicon dioxide.

3. The method according to claim 1 wherein said buffer layer is deposited to a thickness of between about 50 Angstroms and 300 Angstroms.

4. The method according to claim 1 wherein said buffer layer is thermally grown to a thickness of between about 50 Angstroms and 300 Angstroms.

5. The method according to claim 1 wherein said etching endpoint layer is composed-of silicon nitride.

6. The method according to claim 1 wherein said etching endpoint layer is deposited to a thickness of between about 500 Angstroms and 3500 Angstroms.

7. The method according to claim 1 wherein said silicon layer comprises polysilicon deposited to a thickness of between about 1000 Angstroms and 7000 Angstroms.

8. The method according to claim 1 wherein said silicon layer comprises amorphous silicon deposited to a thickness of between about 1000 Angstroms and 7000 Angstroms.

9. A method of forming shallow trench isolation structures in a silicon substrate in an integrated circuit device comprising:

providing a silicon substrate;

depositing a buffer layer overlying said silicon substrate;

depositing an etching endpoint layer overlying said buffer layer;

depositing a silicon layer overlying said etching endpoint layer;

coating a photoresist layer overlying said silicon layer;

exposing to actinic light and developing said photoresist layer wherein said photoresist layer is removed where trenches of said shallow trench isolation structures are planned;

etching through said silicon layer, said etching endpoint layer, and said buffer layer to expose the top surface of said silicon substrate;

etching said silicon layer and said silicon substrate layer until the top surface of said etching endpoint layer is exposed and thereby forming said trenches;

depositing an isolator layer overlying said etching endpoint layer and filling said trenches;

polishing down said isolator layer to expose the top surface of said buffer layer wherein said etching endpoint layer is a polishing stop;

etching away said etching endpoint layer and thereby completing said shallow trench isolation structures; and completing said integrated circuit device.

10. The method according to claim 9 wherein said buffer layer is composed of silicon dioxide.

11. The method according to claim 9 wherein said buffer layer is formed to a thickness of between about 50 Angstroms and 300 Angstroms.

12. The method according to claim 9 wherein said etching endpoint layer is composed of silicon nitride.

13. The method according to claim 9 wherein said etching endpoint layer is deposited to a thickness of between about 500 Angstroms and 3500 Angstroms.

14. The method according to claim 9 wherein said silicon layer comprises polysilicon deposited to a thickness of between about 1000 Angstroms and 7000 Angstroms.

15. The method according to claim 9 wherein said silicon layer comprises amorphous silicon deposited to a thickness of between about 1000 Angstroms and 7000 Angstroms.

16. The method according to claim 9 wherein said insulator layer is composed of silicon dioxide.

17. A method of forming shallow trench isolation structures in a silicon substrate in an integrated circuit device comprising:

providing a silicon substrate;

depositing a silicon dioxide layer overlying said silicon substrate;

depositing a silicon nitride layer overlying said silicon dioxide layer;

depositing a polysilicon layer overlying said silicon nitride layer;

coating a photoresist layer overlying said polysilicon layer;

exposing to actinic light and developing said photoresist layer wherein said photoresist layer is removed where trenches of said shallow trench isolation structures are planned;

etching through said polysilicon layer, said silicon nitride layer, and said silicon dioxide layer to expose the top surface of said silicon substrate;

etching said polysilicon layer and said silicon substrate layer until the top surface of said silicon nitride layer is exposed and thereby forming said trenches;

depositing an isolator layer overlying said silicon nitride layer and filling said trenches;

polishing down said isolator layer and said silicon nitride layer to expose the top surface of said silicon dioxide layer and thereby completing said shallow trench isolation structures; and completing said integrated circuit device.

18. The method according to claim 17 wherein said silicon dioxide layer is formed to a thickness of between about 50 Angstroms and 300 Angstroms.

19. The method according to claim 17 wherein said silicon nitride layer is deposited to a thickness of between about 500 Angstroms and 3500 Angstroms.

20. The method according to claim 16 wherein said polysilicon layer is deposited to a thickness of between about 1000 Angstroms and 7000 Angstroms and wherein said thickness is equal to the depth of said trenches into said silicon substrate.

* * * * *